United States Patent
Kim et al.

(10) Patent No.: US 9,892,918 B2
(45) Date of Patent: Feb. 13, 2018

(54) METHOD OF FORMING PATTERN OF SEMICONDUCTOR DEVICE

(71) Applicant: SAMSUNG ELECTRONICS CO., LTD., Suwon-Si, Gyeonggi-Do (KR)

(72) Inventors: Eun-Sung Kim, Seoul (KR); Kyeong-Mi Lee, Suwon-Si (KR); Seung-Chul Kwon, Suwon-Si (KR); Jeong-Ju Park, Hwaseong-Si (KR); Shi-Yong Yi, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/240,048

(22) Filed: Aug. 18, 2016

(65) Prior Publication Data

US 2017/0125247 A1    May 4, 2017

(30) Foreign Application Priority Data

Nov. 3, 2015  (KR) ........................ 10-2015-0153532

(51) Int. Cl.
| | | |
|---|---|---|
| *G03F 7/004* | (2006.01) | |
| *H01L 21/033* | (2006.01) | |
| *H01L 21/027* | (2006.01) | |
| *H01L 21/02* | (2006.01) | |
| *G03F 7/00* | (2006.01) | |

(Continued)

(52) U.S. Cl.
CPC ...... *H01L 21/0337* (2013.01); *B81C 1/00031* (2013.01); *G03F 7/002* (2013.01); *G03F 7/0035* (2013.01); *G03F 7/165* (2013.01); *G03F 7/38* (2013.01); *G03F 7/40* (2013.01); *H01L 21/0271* (2013.01); *H01L 21/02118* (2013.01);

(Continued)

(58) Field of Classification Search
CPC ........ G03F 7/002; G03F 7/165; G03F 7/0035; G03F 7/38; G03F 7/40; G03F 7/2016; H01L 21/0271; H01L 21/31144; H01L 21/033; H01L 21/0337; B81C 1/00031; B81C 2201/0149
USPC ........ 430/322, 323, 324, 330, 331; 438/311, 438/780, 947; 216/41
See application file for complete search history.

(56) References Cited

U.S. PATENT DOCUMENTS 8,486,613 B2    7/2013  Kim et al.
8,974,682 B2    3/2015  Hieda et al.
(Continued)

FOREIGN PATENT DOCUMENTS

JP         4673266       1/2011
JP         2014-187103   10/2014
(Continued)

*Primary Examiner* — Amanda C Walke
(74) *Attorney, Agent, or Firm* — Volentine & Whitt, PLLC

(57) ABSTRACT

A method of forming a pattern of a semiconductor device includes forming a lower film on a substrate having a first surface and a second surface at different levels, forming an upper film of hydrophobic material on the lower film, forming a block copolymer film on the upper film, phase-separating the block copolymer film to form first patterns spaced apart from one another and a second pattern spanning the first patterns and interposed between a bottom surface of each of the first patterns and the upper film, removing the first patterns, and performing an etch process using the second pattern or a residual part of the second pattern as an etch mask.

20 Claims, 32 Drawing Sheets

(51) Int. Cl.
  *G03F 7/40* (2006.01)
  *G03F 7/38* (2006.01)
  *G03F 7/16* (2006.01)
  *B81C 1/00* (2006.01)

(52) U.S. Cl.
  CPC .... *H01L 21/02348* (2013.01); *H01L 21/0332* (2013.01); *B81C 2201/0149* (2013.01)

(56) References Cited

U.S. PATENT DOCUMENTS

| | | | |
|---|---|---|---|
| 9,418,860 B2* | 8/2016 | Somervell | G03F 7/42 |
| 9,613,820 B1* | 4/2017 | Chou | G03F 7/2016 |
| 2012/0196089 A1 | 8/2012 | Yang et al. | |
| 2013/0099362 A1* | 4/2013 | Kim | B81C 1/00031 |
| | | | 257/623 |
| 2014/0061154 A1* | 3/2014 | Kim | G03F 7/0035 |
| | | | 216/49 |
| 2014/0193580 A1 | 7/2014 | Tiron et al. | |
| 2014/0315390 A1* | 10/2014 | Abdallah | H01L 21/3081 |
| | | | 438/703 |
| 2014/0335324 A1* | 11/2014 | Kim | B44C 1/227 |
| | | | 428/195.1 |
| 2014/0370712 A1 | 12/2014 | Kim et al. | |
| 2014/0370717 A1* | 12/2014 | Chakrapani | H01L 21/31138 |
| | | | 438/725 |
| 2015/0153649 A1 | 6/2015 | Lee et al. | |
| 2015/0168841 A1 | 6/2015 | Matsunaga et al. | |
| 2015/0243525 A1* | 8/2015 | Park | H01L 21/31144 |
| | | | 438/703 |
| 2016/0104628 A1* | 4/2016 | Metz | H01L 21/3086 |
| | | | 438/703 |
| 2016/0276167 A1* | 9/2016 | Seino | H01L 21/31138 |

FOREIGN PATENT DOCUMENTS

| | | |
|---|---|---|
| KR | 2012-0126442 A | 11/2012 |
| WO | WO 2014-148351 A1 | 9/2014 |

* cited by examiner

Homogeneous

METHOD OF FORMING PATTERN OF SEMICONDUCTOR DEVICE

This application claims priority from Korean Patent Application No. 10-2015-0153532 filed on Nov. 3, 2015 in the Korean Intellectual Property Office, the disclosure of which is hereby incorporated by reference in its entirety.

BACKGROUND

1. Field

The inventive concept relates to the forming of patterns of semiconductor devices. In particular, the inventive concept relates to a directed self assembly (DSA) of forming features of a semiconductor device on a nanoscale.

2. Description of the Related Art

As semiconductor devices become highly integrated, the line width of patterns in semiconductor devices becomes finer. Accordingly, there are various nanolithography processes of forming fine patterns during the processes of fabricating semiconductor devices. These nanolithography processes include double patterning technology (DPT), quadruple patterning technology (QPT) and extreme ultra violet (EUV) lithography as top-down methods, and directed self assembly (DSA) and nano imprinting as bottom-up methods.

SUMMARY

According to an aspect of the inventive concept, there is provided a method of forming a pattern of a semiconductor device, including: forming a lower film on a substrate, the lower film comprising a first surface and a second surface with a level difference therebetween; forming an upper film containing a hydrophobic material on the lower film; coating a block copolymer film on the upper film; phase-separating the block copolymer film to form first patterns spaced apart from one another and a second pattern making up between the first patterns on the first surface and the second surface; removing the first patterns or the second pattern; and performing an etch process using the first patterns and a residual part of the second pattern as an etch mask, wherein the second patterns is disposed between a bottom surface of each of the first patterns and the upper film.

According to another aspect of the inventive concept, there is provided a method of forming a pattern of a semiconductor device, including: preparing a substrate on which a lower film and a neutral film are formed sequentially; removing a part of the neutral film to expose a part of the lower film; etching the exposed part of the lower film to form a trench; forming a hydrophobic film in the trench; coating a block copolymer film on the neutral film and the hydrophobic film; phase-separating the block copolymer film to form first patterns spaced apart from one another and a second pattern making up between the first patterns on the neutral film and the hydrophobic film; removing the first patterns or the second patterns; and performing an etch process using the first patterns and a residual part of the second pattern as an etch mask, wherein the second pattern is disposed between a bottom surface of each of the first patterns and the hydrophobic film.

According to another aspect of the inventive concept, there is provided a method of forming a pattern of a semiconductor device, including: forming a lower film on a substrate; forming a mask film pattern on the lower film; performing an etch process using the mask film pattern to form a first surface and a second surface with a level difference therebetween; removing the mask pattern; forming a hydrophobic film on the first surface and the second surface; coating a block copolymer film on the hydrophobic film; phase-segregating the block copolymer film to form first patterns spaced apart from one another and second pattern making up between the first patterns on the first surface and the second surface; removing the first patterns or the second patterns; and performing an etch process using the first patterns and a residual part of the second pattern as an etch mask, wherein the second patterns is disposed between a bottom surface of each of the first patterns and the hydrophobic film.

According to another aspect of the inventive concept, there is provided a method of forming a pattern of a semiconductor device, including: forming a lower film on a substrate and then a neutral film on the lower film; forming a mask film pattern on the neutral film; performing an etch process using the mask film pattern to remove a part of the neutral film; removing a part of the lower film exposed via the removed neutral film to form a trench in the lower film; removing the mask film pattern; forming a hydrophobic film in the trench; coating a block copolymer film on a residual part of the neutral film and the hydrophobic film; phase-separating the block copolymer film to form first patterns spaced apart from one another and a second pattern making up between the first patterns on the residual part of the neutral film and the hydrophobic film; removing the first patterns or the second pattern; and performing an etch process using the first patterns and a residual part of the second pattern as an etch mask, wherein the second pattern is disposed between a bottom surface of each of the first patterns and the hydrophobic film.

According to another aspect of the inventive concept, there is provided a method of forming a pattern of a semiconductor device, including: forming a lower structure comprising hydrophobic or hydrophilic material on a substrate, forming an upper layer of block copolymer comprising hydrophobic and hydrophilic material on the lower structure, treating the block copolymer film to form first patterns and a second pattern, removing the first or second patterns, and subsequently performing an etch process using at least part of the other of the first patterns and the second pattern as an etch mask. The lower structure has a top portion constituted by one of hydrophobic and hydrophilic material, the lower structure defines recesses therein open at the top of the lower structure, and the hydrophobic and hydrophilic material is disposed in and/or defines the recesses. The first patterns are formed as spaced apart from one another, and the second pattern spans the first patterns. Respective ones of the first patterns are aligned with the recesses, respectively, and others of the first patterns are located at regions of the device between respective ones of the recesses.

According to another aspect of the inventive concept, there is provided a method of forming a pattern of a semiconductor device, including: forming a lower film on a substrate, the lower film having a first surface and a second surface disposed at different levels above the substrate with the second surface being closer to the substrate than the first surface, forming an upper film of hydrophobic material on the lower film, forming a film of block copolymer on the upper film, phase-separating the film of block copolymer to form first patterns spaced apart from one another on the first and second surfaces of the lower film, and a second pattern spanning the first patterns and interposed between a bottom surface of each of the first patterns and the upper film, removing the first patterns, and subsequently performing an etch process using at least part of the second pattern as an etch mask.

According to another aspect of the inventive concept, there is provided a method of forming a pattern of a semiconductor device, including: providing a structure comprising a substrate, a lower film disposed on the substrate, and a neutral film disposed on the lower film, removing part of the neutral film to expose a part of the lower film, etching the exposed part of the lower film to form a trench, forming a hydrophobic film in the trench, coating the neutral film and the hydrophobic film with a block copolymer to form a block copolymer film on neutral film and the hydrophobic film, phase-separating the block copolymer film to form first patterns spaced apart from one another and a second pattern spanning the first patterns on the neutral film and the hydrophobic film and interposed between a bottom surface of each of the first patterns and the hydrophobic film, removing the first patterns, and performing an etch process using at least part of the second pattern as an etch mask.

BRIEF DESCRIPTION OF THE DRAWINGS

The above and other aspects and features of the inventive concept will become more apparent by describing in detail examples thereof with reference to the attached drawings, in which:

FIGS. 4 through 17 illustrate processing steps of a method of forming a pattern of a semiconductor device according to some examples of the inventive concept, wherein FIGS. 5, 7, 9, 11, 14 and 16 are plan views of the device during the course of the forming of the pattern, FIGS. 4, 6, 8, 10, 12 and 15 are sectionals views taken along lines A-A of FIGS. 5, 7, 9, 11 and 16, and FIG. 13 is an enlarged view of region P1 of FIG. 12;

FIGS. 20 and 21 illustrate a method of forming a pattern of a semiconductor device according to some examples of the inventive concept, wherein FIG. 20 is a plan view of the device during the course of forming the pattern and FIG. 21 is a sectional view taken along line B-B of FIG. 20;

DETAILED DESCRIPTION

Figure 1:
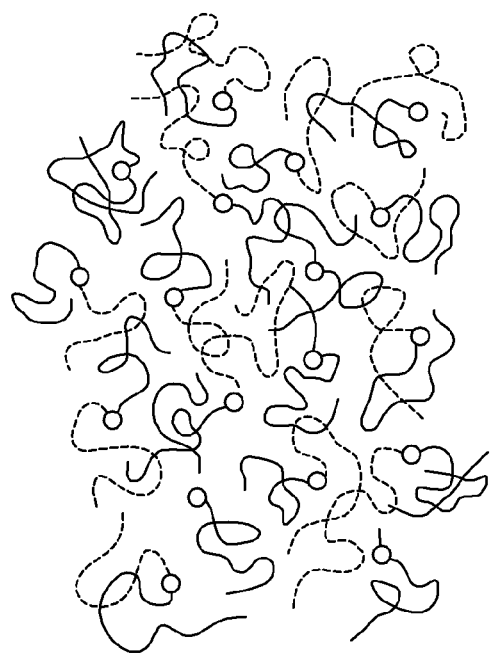
FIGS. 1 and 2 are conceptual diagrams illustrating a phase separation process of block copolymers.

Advantages and features of the inventive concept and methods to achieve them will become apparent from the descriptions of examples hereinbelow with reference to the accompanying drawings. However, the inventive concept is not limited to examples disclosed herein but may be implemented in various different ways. The examples are provided for making the disclosure of the inventive concept thorough and for fully conveying the scope of the inventive concept to those skilled in the art. It is to be noted that the scope of the inventive concept is defined only by the claims. Like reference numerals denote like elements throughout the descriptions. The term "and/or" used herein includes any and all combinations of one or more of the associated listed items.

As used herein, a phrase such as "an element A on an element B" may refer to either a case in which the element A is disposed directly on the element B or a case in which the element A is disposed indirectly on the element B via another element C (or elements). On the other hand, a phrase such as "an element A directly on an element B" refers only to a case in which the element A is disposed directly on the element B without any intervening element(s).

Spatially relative terms, such as "below," "beneath," "lower," "above," "upper" and the like may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the term "below" can encompass both orientations of above and below. The device may be otherwise oriented and the spatially relative descriptors used herein interpreted accordingly.

Terms used in the present specification are for explaining the examples rather than limiting the inventive concept. Unless specifically mentioned otherwise, a singular form includes a plural form in the present specification. Throughout this specification, the word "comprise" and variations such as "comprises" or "comprising," will be understood to imply the inclusion of stated constituents, steps, operations and/or elements but not the exclusion of any other constituents, steps, operations and/or elements. The word "include" and variations thereof when used to describe a material of a particular feature or element does not imply that the feature or element is made up of a material or materials other than that specified.

As used herein, the terms first, second, etc., are used for distinguishing between similar elements and not necessarily for describing a sequential or chronological order. Theses terms are used to merely distinguish one element from another. Accordingly, as used herein, a first element may be a second element within the technical scope of the inventive concept.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. For example, the term "pattern" may at times be used to refer to one feature in a series of similar features that have been formed by some patterning process or may refer collectively to the entire series of features formed by the patterning process. The term "extending" will generally reference the lengthwise direction, i.e., the greatest dimension, of an element or feature, especially one having a line-shaped form, as the context and drawings will make clear. The word "recess" will be used in its broadest sense to describe any form of opening, such as a trench or hole, in or through a particular layer. The word "aligned" will be understood as meaning overlapping as viewed in plan and may also be understood as more specifically meaning substantially centered with respect to.

A method of forming a pattern of a semiconductor device described hereinbelow relates to a directed self assembly (DSA) process that improves processing stability and saves cost in the process of forming a fine pattern. In particular, examples of the inventive concept include a DSA process in which features formed from a block copolymer are bonded to one another by a hydrophobic film having recesses to thereby increase pinning power and reduce defects in the grid.

In addition, examples of the inventive concept include a heterogeneous DSA process in which a neutral film and a hydrophobic film are used together to enhance pinning power for bonding block copolymers.

Figure 2:
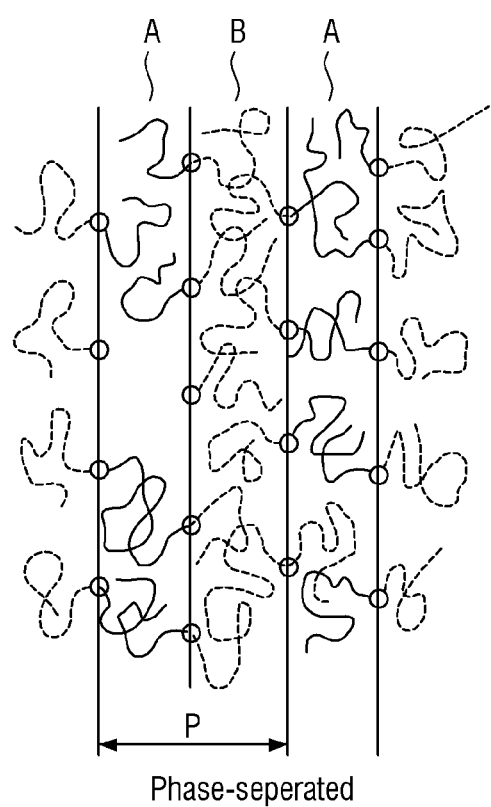

FIGS. 1 and 2 illustrate a phase separation process of block copolymers.

Prior to describing a method of forming a pattern of a semiconductor according to the inventive concept, the DSA process will be described briefly. DSA lithography refers to a technique in which components of a system assemble themselves spontaneously to form a pattern. In DSA lithography, a layer of resist is patterned without using a photolithography "exposure" process. More specifically, DSA lithography entails chemoepitaxy, and includes applying a block copolymer consisting of two chemically-different polymeric chains as a resist onto a substrate (e.g., a wafer), and then heating the substrate whereupon the polymeric chains "self-assemble" to thereby form a fine pattern of features. Currently, EUV lithography is often turned to as the nanolithography method of choice, i.e., EUV lithography is widely used throughout the semiconductor device fabrication industry. However, as semiconductor nanolithography, such as EUV lithography, reaches its limit and it becomes increasingly difficult to form fine patterns using such photolithographic techniques, DSA lithography is gaining attention.

Referring to FIGS. 1 and 2, first ends of blocks A of one (a first) polymer (represented by the solid lines) are linked to first ends of blocks B of a different (a second) polymer (represented by the dashed lines) by covalent bonds, respectively, and block junctions link the first ends A, B of the blocks of different polymers, for example. The other ends of the blocks A, B of the polymers, which are not linked by the block junctions, repel each other. For example, one of the first polymer and the second polymer may be hydrophilic whereas the other of the first polymer and the second polymer may be hydrophobic. The hydrophilic polymer may have polarity.

When an annealing process is performed in a homogeneous state in which the blocks A of the first polymer and the blocks B of the second polymer are randomly arranged in the block copolymer, the blocks A of the first polymer and the blocks B of the second polymer self-assemble into respective domains, i.e., the block copolymer enters a microphase separation state. In the microphase separation state, the pitch P of the domains of the blocks A of the first polymer is constant. That is, the widths of the domains of the blocks A of the first polymer and the widths of the domains of the blocks B of the second polymer are constant, respectively. The width of the domain of blocks A of the first polymer and the width of the domain of blocks B of the second polymer depend on the respective molecular weights of the first and second polymers.

Hereinafter, a method of forming a pattern of a semiconductor device according to some examples of the inventive concept will be described with reference to FIGS. 3 to 17.

Referring to FIGS. 3 to 6, a lower film 200 is formed on a substrate 100, an anti-reflection film 210 is formed on the lower film 200, and a first mask film pattern M1 is formed on the anti-reflection film 210. The anti-reflection film 210 is optional, however.

A plurality of first openings or holes 200t is formed in the lower film 100 using the first mask film pattern M1. The resulting lower film 200 will be referred to hereinafter as a lower film structure 200a. This stage of the process may be represented by step S100 in FIG. 3. The lower film structure 200a may be an insulation film composed of a single layer or multiple layers, and may include a conductive film. The lower film structure 200a may be formed by deposition and etch processes. Each of the first holes 200t formed in the lower film structure 200a may have a first width W1.

Figure 3:
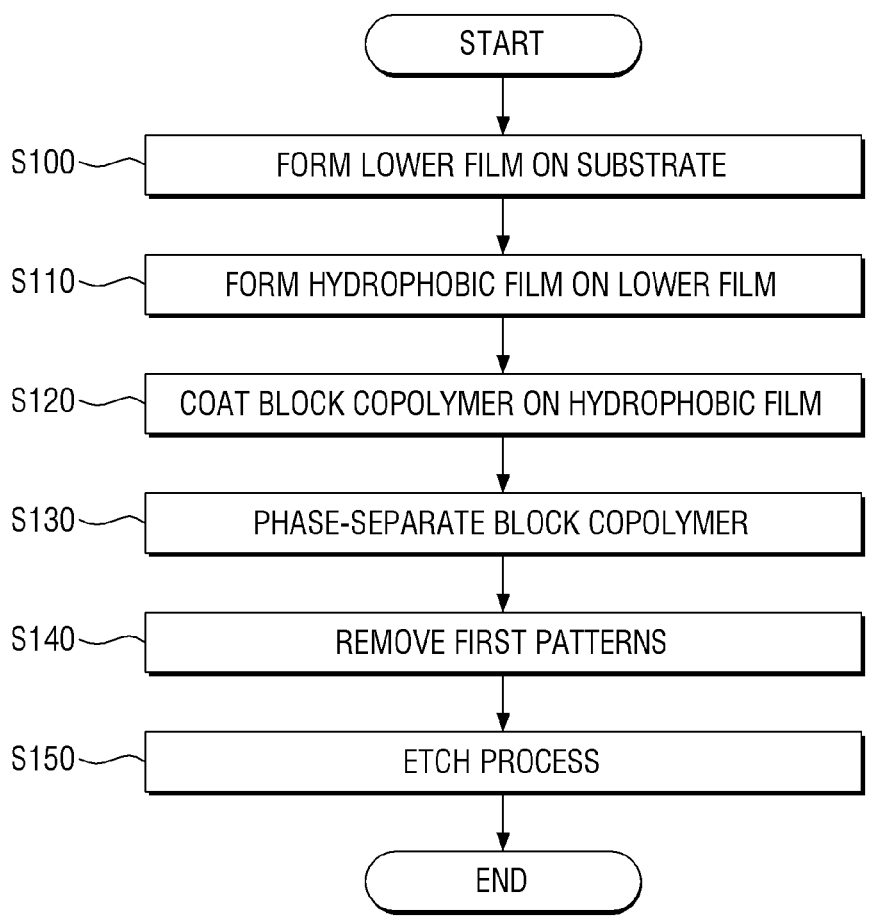
FIG. 3 is a flow chart illustrating a method of forming a pattern of a semiconductor device according to some examples of the inventive concept.
Figure 4:
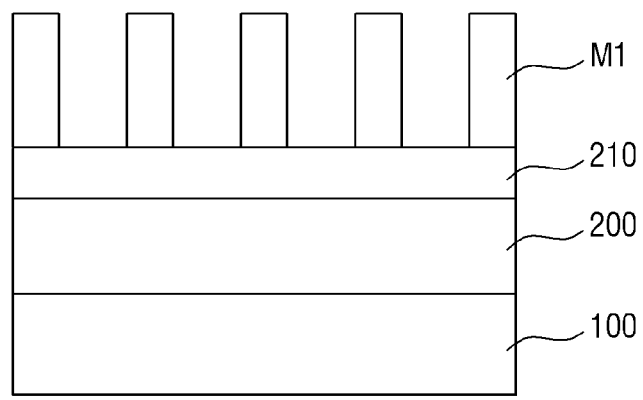
Figure 5:
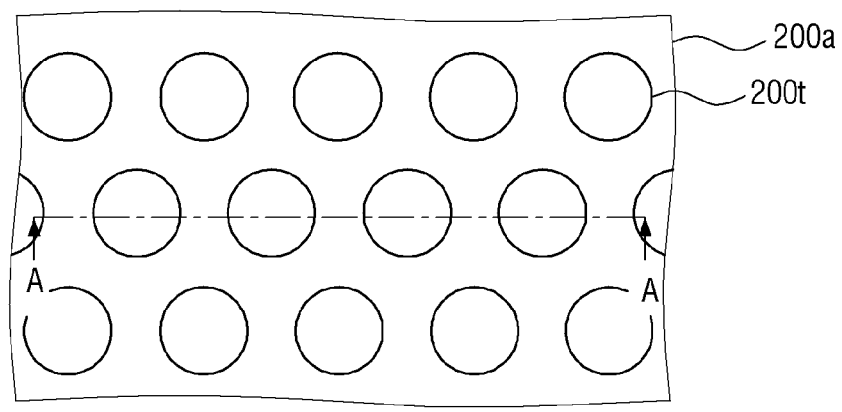
Figure 6:
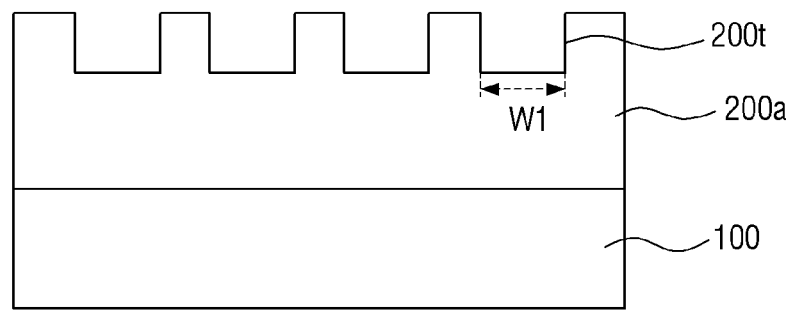
Figure 7:
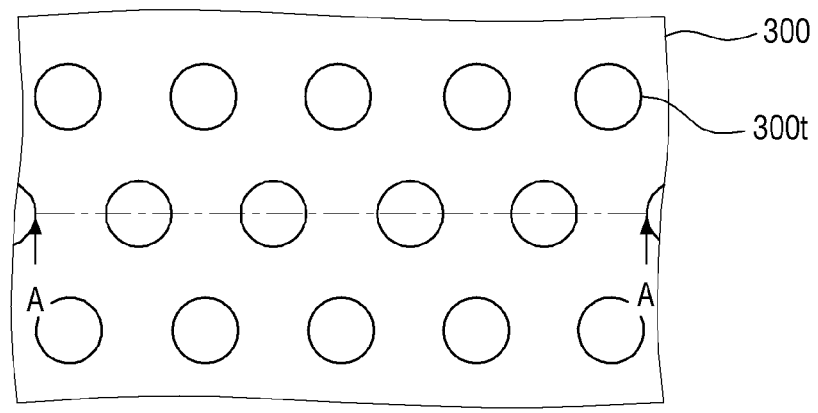
Figure 8:
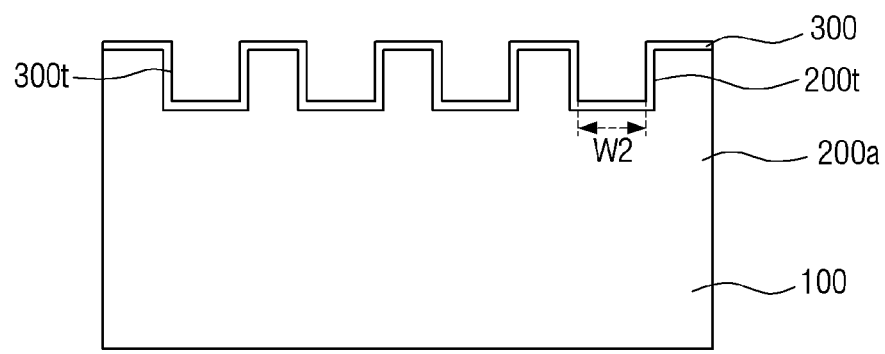

Referring to FIGS. 7 and 8, a hydrophobic film 300 is formed on and conforms to the entire surface of the substrate 100 on which the lower film structure 200a is formed (S110 in FIG. 3). That is, the thickness of the hydrophobic film 300 may be substantially equal across the bottom surface and side wall surfaces delimiting the first holes 200t and the upper surface of the lower film structure 200a. As a result, a lower structure is formed.

The hydrophobic film 300 may be formed by a coating process. As the hydrophobic film 300 is formed on and conforms to the lower film structure 200a having openings therein, the hydrophobic film 300 may also define openings. That is, a plurality of second openings or holes 300t may be delimited by the hydrophobic film 300 within the first holes 200t, respectively.

The width W2 of the second holes 300t is less than the width W1 of the first holes 200t by the thickness of the hydrophobic film 300. The hydrophobic film 300 has affinity for hydrophobic copolymer blocks. The hydrophobic film 300 may have affinity for the more hydrogenated one of the blocks of polymers of the block copolymer, or may have affinity for one of the cylindrical blocks of polymers that has a higher molecular weight percent in the block copolymer and thus forms the outer layer. For example, the hydrophobic film 300 may include polystyrene (PS).

Figure 9:
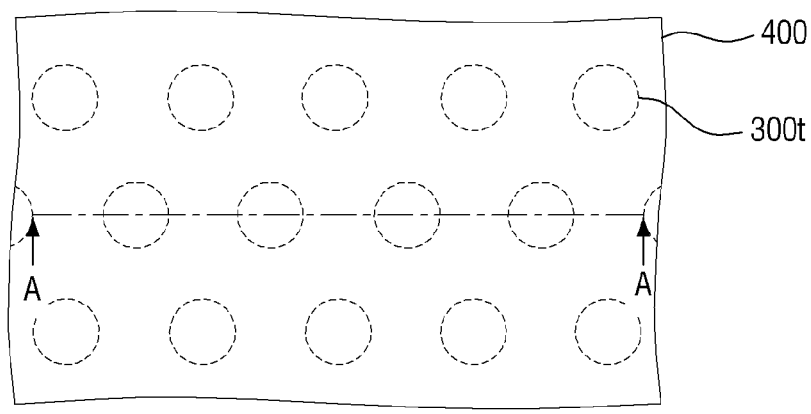
Figure 10:
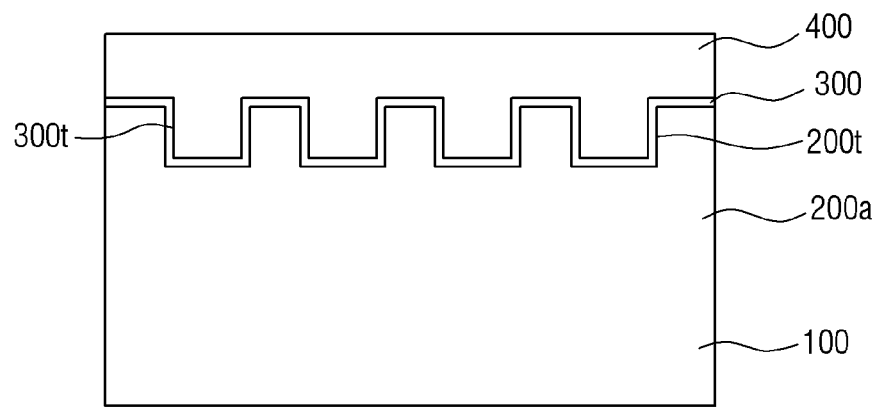

Referring to FIGS. 9 and 10, the hydrophobic film 300 is coated with a block copolymer film 400 (S120 in FIG. 3).

Block copolymers of the block copolymer film 400 may include hydrophilic polymers and hydrophobic polymers bonded as blocks.

For example, the block copolymer film may include at least one material selected from the group consisting of: polystyrene-block-polymethylmethacrylate (PS-b-PMMA), polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, and polystyrene-block-polyethyleneoxide-block-polystyrene.

The block copolymer film 400 may be formed by dissolving a block copolymer in a solvent, and then performing a spin coating or the like process to coat the hydrophobic film 300 with the resulting aqueous solution. The solvent may be toluene, for example. Most of the solvent evaporates by the end of the coating process.

Preferably, the block copolymer is polystyrene-block-polymethylmethacrylate (PS-b-PMMA). In some examples, the block copolymer may be composed of polystyrene (PS) of approximately 70% by volume and PMMA of approximately 30% by volume.

Figure 11:
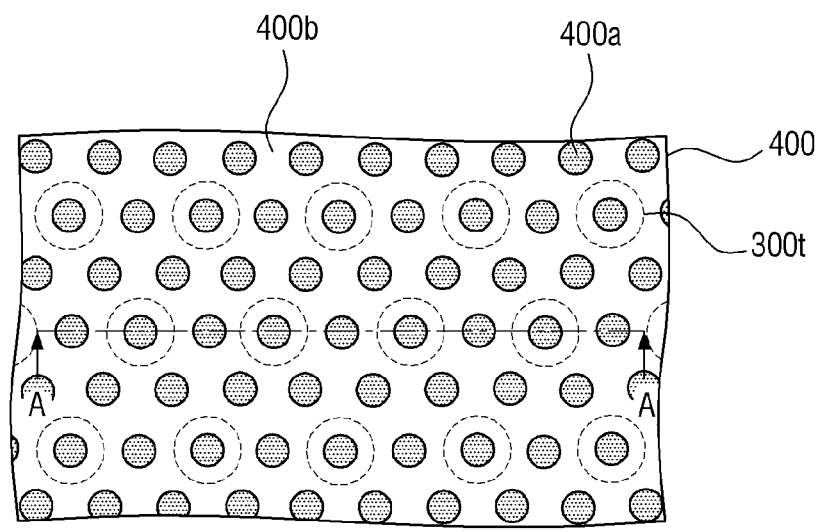
Figure 12:
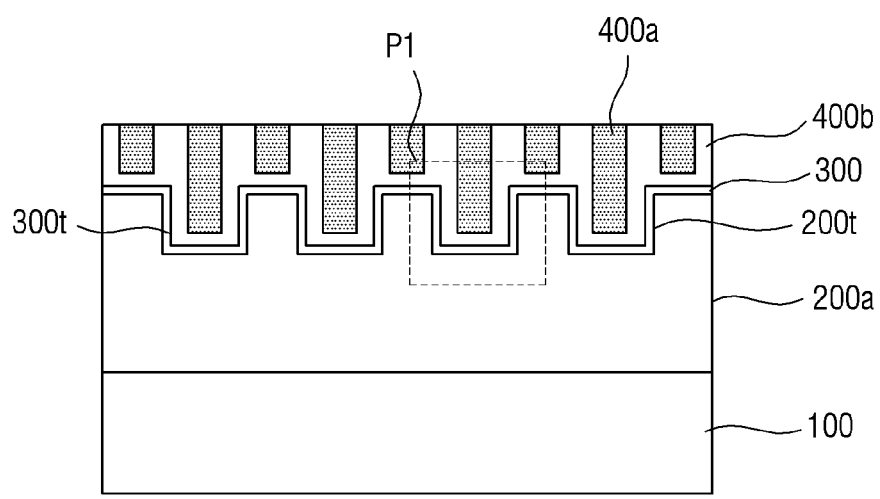
Figure 13:
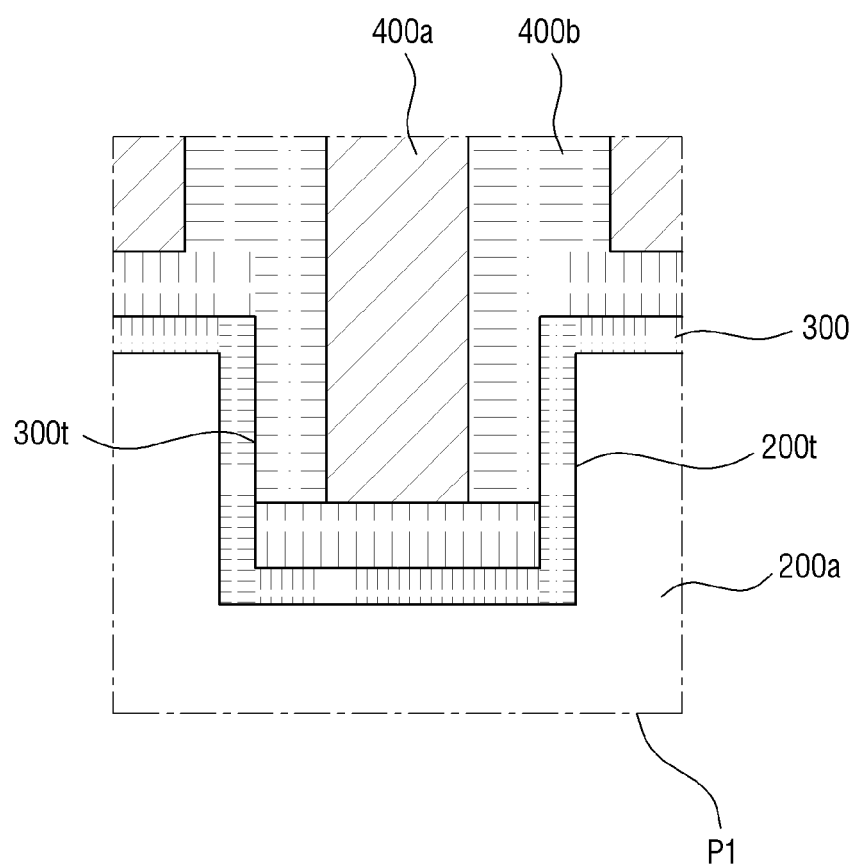

Referring to FIGS. 11 and 13, an annealing process is carried out by irradiating the block copolymer film 400 with ultraviolet (UV) rays or heating it. The annealing process may be performed at the glass transition temperature Tg of the block copolymer or higher. Micro-phase separation (S130 in FIG. 3) takes place in the block copolymer film 400 due to the annealing process, and first patterns 400a and a second pattern 400b are formed on the hydrophobic film 300.

The first patterns 400a may be cylindrical. The second pattern 400b may span the first patterns 400a. The first patterns 400a and the second pattern 400b may have different properties. For example, the first patterns 400a may be hydrophilic while the second pattern 400b may be hydrophobic. For example, the first patterns 400a may be of PMMA, and the second pattern 400b may be of PS.

The surface of the hydrophobic film 300 delimiting the bottom of each of the second holes 300t has affinity for hydrophobic polymer blocks. Therefore, the hydrophobic second pattern 400b may bond to the outer periphery of the surface of the hydrophobic film 300 delimiting the bottom of each of the second holes 300t. That is, in each of the second holes 300t, the second pattern 400b may be interposed between the bottoms of the first patterns 400a and the hydrophobic film 300. With this configuration, strong pinning power is created due to the chemical affinity between the hydrophobic second patterns 400b and the hydrophobic film 300. In addition, in this configuration, there is strong pinning power between the hydrophobic film 300 and the second patterns 400b due to the hydrophobic film 300 on the sides of the second holes 300t. Accordingly, the first patterns 400a are aligned vertically and held tightly, and fewer defects arise in the grid of first patterns 400a.

Furthermore, the second holes 300t may be formed to such a size that only one first pattern 400a is formed in each of the second holes 300t. A respective first pattern 400a may be disposed in the center of each second hole 300t. Also, in some examples, only one first pattern 400a may be disposed on the hydrophobic film 300 between adjacent ones of the second holes 300t. The first patterns 400a may be equally spaced apart from one another.

The spacing between the first patterns 400a may be substantially equal to the diameter of the first patterns 400a. The width W2 of the second holes 300t may be larger than the diameter of the first patterns 400a and may be smaller than three times the diameter of the first patterns 400a so that only one first pattern 400a is disposed in each of the second holes 300t. The width W2 of the second holes 300t can be designed for so that the first patterns 400a are formed at desired locations.

As a characteristic of examples of this method according to the inventive concept, the sizes of the patterns 400a and 400b and the width and the depth of the second holes 300t will typically be greater the higher the molecular weights of the selected hydrophilic polymers and the hydrophobic polymers of the block copolymers become. Furthermore, although the critical dimension (CD) of the first holes 200t is limited by the resolution of the exposure process used to form the first holes 200*t*, the first patterns 400*a* may have a diameter smaller than the width W1 of the first holes 200*t*. The pitch of the first patterns 400*a* (equal to the distance between adjacent ones of the first patterns 400*a*) may be 20 nm to 60 nm, for example.

Figure 14:
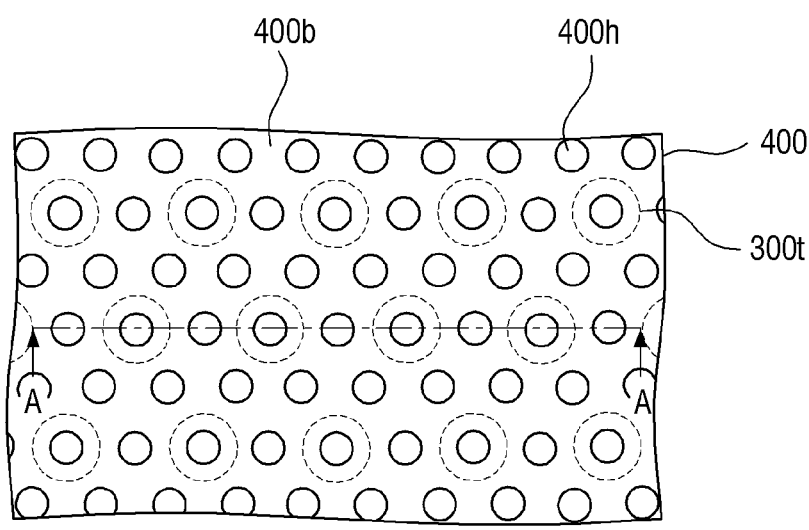
Figure 15:
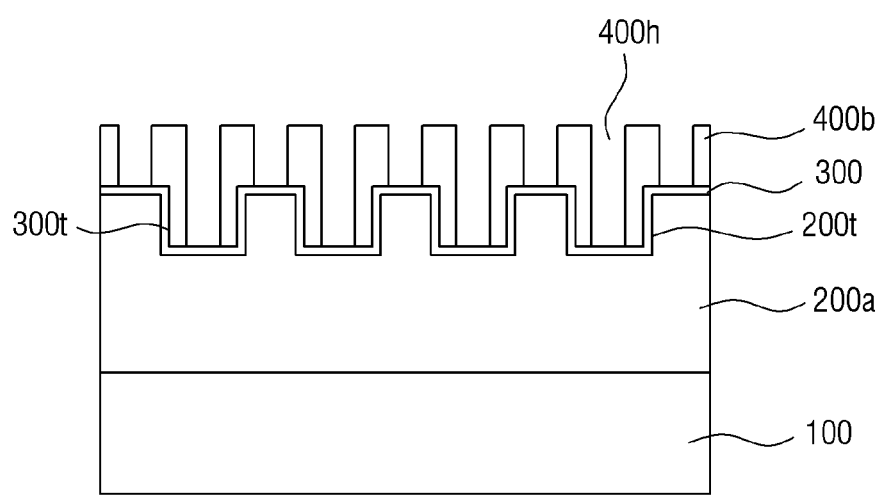

Referring to FIGS. 14 and 15, the first patterns 400*a* are selectively removed (S140 in FIG. 3). To this end, the first patterns 400*a* may be irradiated with deep ultraviolet (DUV) rays and undergo a wet etch process using an etchant such as isopropyl alcohol (IPA). Alternatively, the first patterns 400*a* may be selectively removed by performing a dry etch process using a fluorine-based gas, argon, oxygen, etc. As a result, third holes 400*h* are formed. The top surface of the hydrophobic film 300 may be exposed by the third holes 400*h*. At this time, the second pattern 400*b* or substantial portions thereof remain on the lower film structure 200*a*.

Figure 16:
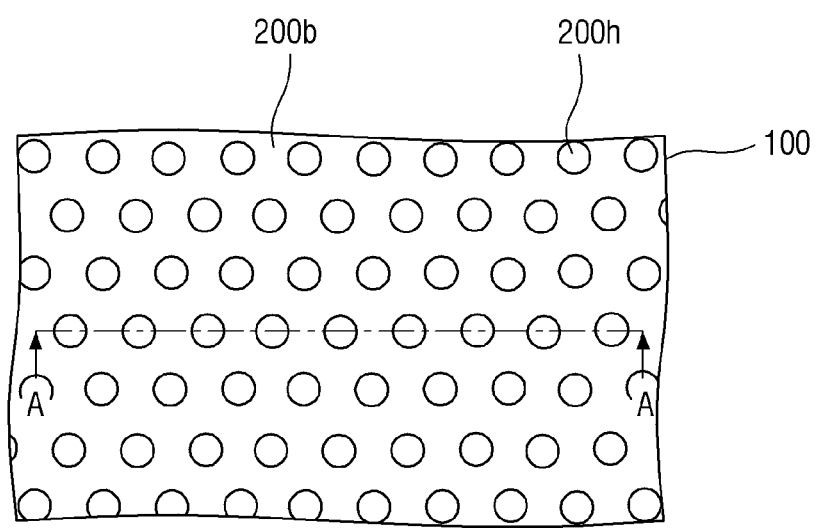
Figure 17:
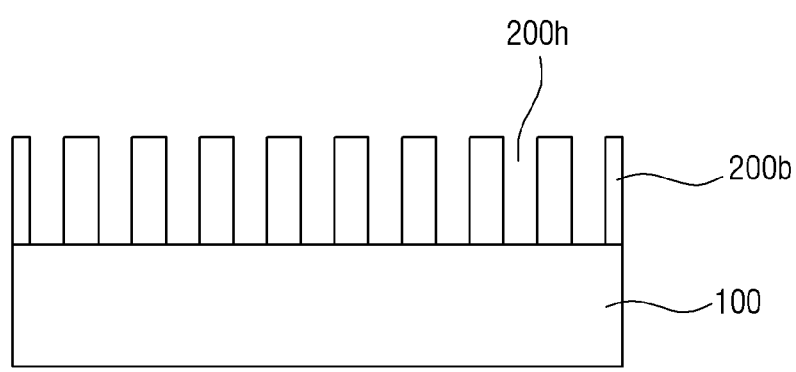

Referring to FIGS. 16 and 17, the lower film structure 200*a* is etched using the second pattern 400*b* as an etch mask (S150 in FIG. 3), thereby forming a lower film pattern 200*b* including fourth holes 200*h* having substantially the same pattern as the third holes 400*h*, i.e., the pattern of the third holes 400*h* is transferred to the lower film structure 200*a*.

In the method of forming a pattern of a semiconductor device according to some examples of the inventive concept as described above, the block copolymer film 400 is formed on the hydrophobic film 300 defining recesses on the substrate 100, and phase separation is induced. The hydrophobic film 300 has affinity for the hydrophobic polymer blocks of the block copolymer, and thus strong pinning power can be created between the second pattern 400*b* and the hydrophobic film 300 in the recesses to ensure that the first patterns 400*a* are vertical in and aligned with the recesses. In addition, it is possible to form a pattern having a dimension (e.g., a critical dimension) smaller than the minimum resolution of an exposure process by using block copolymers of certain molecular weights.

Figure 18:
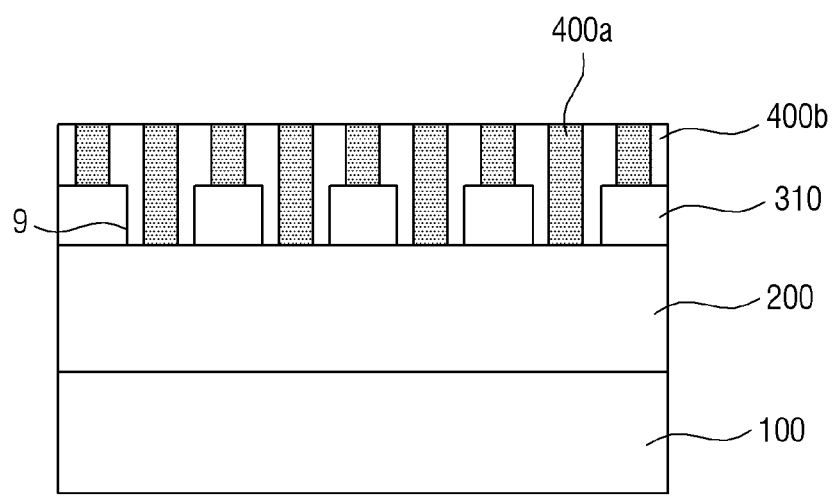
FIG. 18 is a sectional view for use in illustrating a method of forming a pattern of a semiconductor device according to some examples of the inventive concept.

FIG. 18 illustrates a method of forming a pattern of a semiconductor device according to some other examples of the inventive concept. For the sake of brevity, aspects and features of the method substantially identical to those described above will not be described again.

Referring to FIG. 18, the top surface of the lower film 200 is flat, and a plurality of holes or openings 9 are formed in a hydrophilic film 310. The hydrophilic film 310 may be formed by a coating or deposition process of forming the film 310 on the flat top surface of the lower film 200, and an etch process of etching the film 310. That is, instead of etching the lower film 200 to form the lower film structure, the hydrophilic film 310 is etched so that it has the holes or openings 9 in which the first patterns 400*a* and second pattern 400*b* are formed. The lower film 200 and the hydrophilic film 310 may together constitute a lower structure.

In this example, the hydrophilic film 310 has affinity for the hydrophilic polymer blocks of the block copolymer, and thus strong pinning power can be created between the first patterns 400*a* and the hydrophilic film 310 in the recesses to ensure that the first patterns 400*a* are vertical in and aligned with the recesses. Also, in this example, either the first patterns 400*a* or the second pattern 400*b* can be removed, and the underlying structure (hydrophilic film 310 and lower film 200) can be etched using the remaining first patterns 400*a* or second pattern 400*b* as an etch mask.

Figure 19:
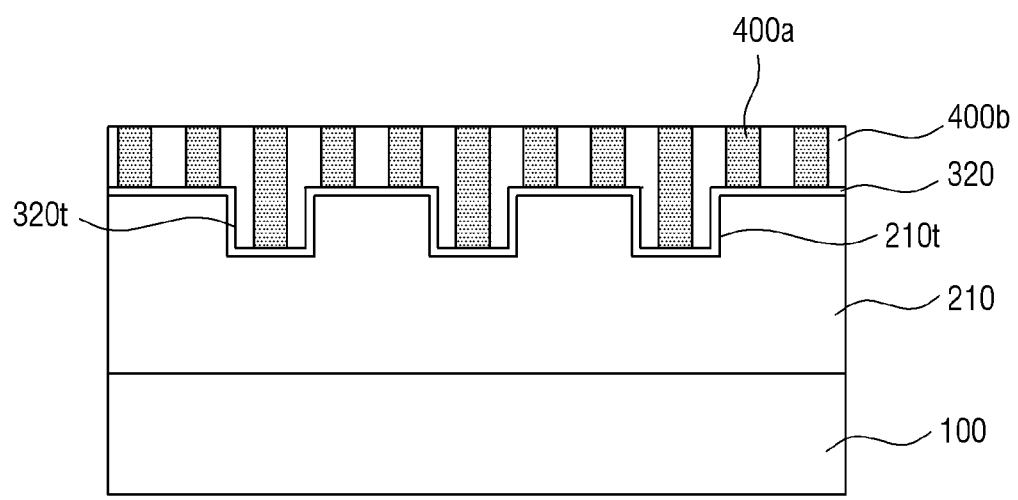
FIG. 19 is a sectional view for use in illustrating a method of forming a pattern of a semiconductor device according to some examples of the inventive concept.

FIG. 19 illustrates a method of forming a pattern of a semiconductor device according to still some other examples of the inventive concept. Again, for the sake of brevity, aspects and features of the method substantially identical to those described above will not be described again.

Referring to FIG. 19, two first patterns 400*a* may be formed on hydrophilic film 320 between two adjacent second holes 320*t* of each respective pair of the second holes 320*t*. The lower film 200 and the hydrophilic film 320 may together constitute a lower structure. In this example, the distance between the second holes 320*t* may be larger than the distance between the first patterns 400*a* described above with reference to the example of FIGS. 3-17.

Figure 20:
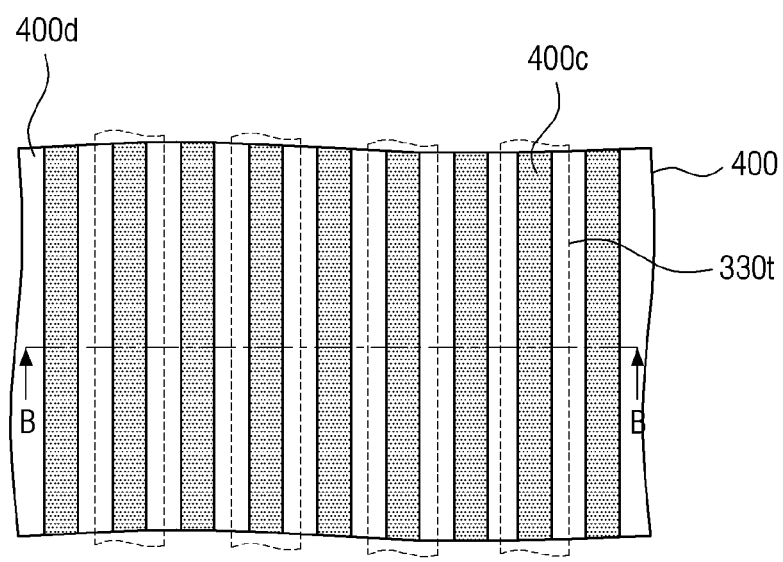
Figure 21:
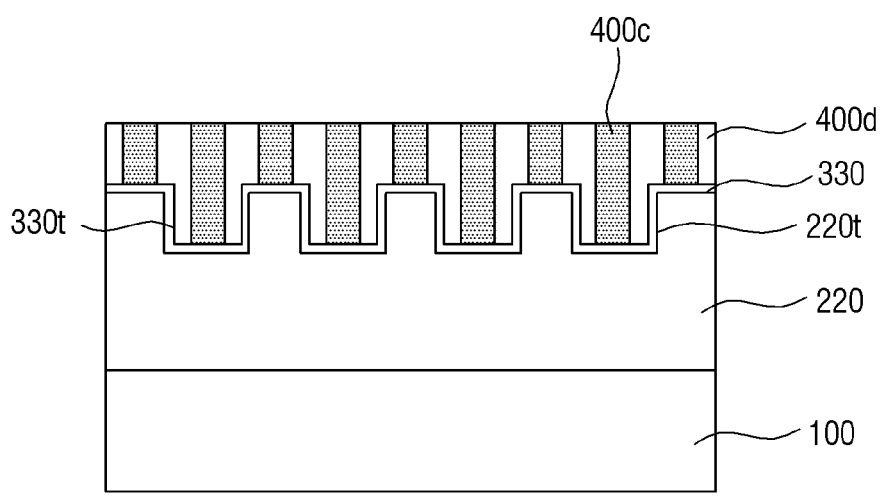

FIGS. 20 and 21 illustrate a method of forming a pattern of a semiconductor device according to other examples of the inventive concept. Again, for the sake of brevity, aspects and features of this method substantially identical to those described above will not be described again.

Referring to FIGS. 20 and 21, patterns 400*c* and 400*d* may have the form of lamellae. Specifically, linear and parallel first grooves 220*t* are formed in the lower film structure 220 (S100), and the hydrophobic film 330 is formed on (S110) and conforms to the lower film structure 220, such that linear and parallel second grooves 330*t* are delimited by the hydrophobic film 330 within the first grooves 220*t*.

The volumetric ratio of hydrophilic polymer to hydrophobic polymer in the block copolymer (formed in S120) may be approximately 50:50. In this case, the first patterns and second patterns 400*c* and 400*d* (formed in S130) will each have a linear or elongated shape. Only one respective first pattern 400*c* may be formed in each second groove 330*t*. The pitch of the first patterns 400*a* may be 20 nm to 60 nm, for example.

Figure 22:
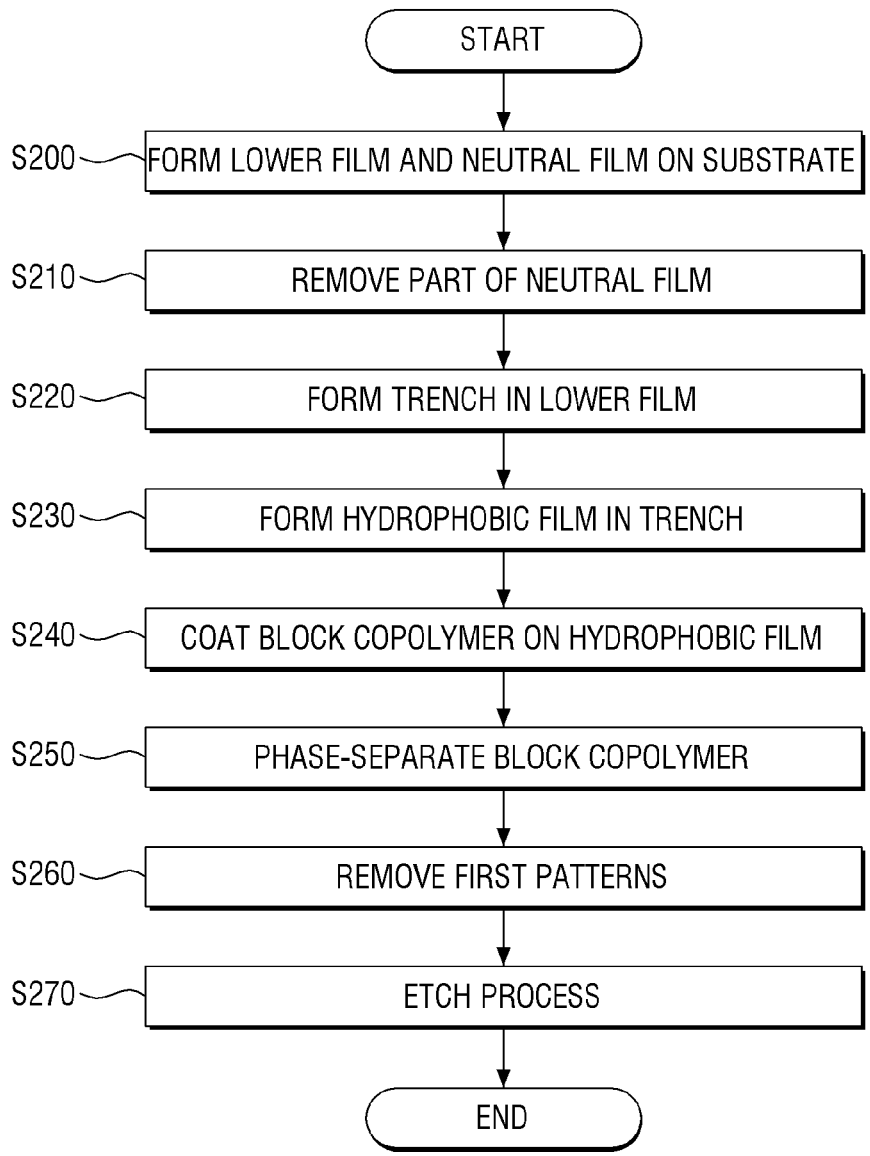
FIG. 22 is a flow chart illustrating a method of forming a pattern of a semiconductor device according to some examples of the inventive concept.
Figure 23:
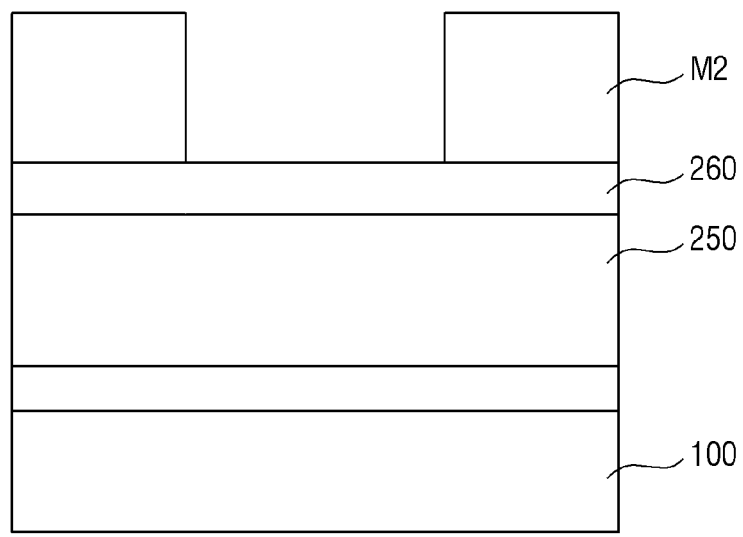
FIGS. 23, 24, 25, 26 and 27 are sectional views of a semiconductor device during the course of forming a fine pattern thereof and together illustrate a method of forming a pattern of a semiconductor device according to yet some other examples of the inventive concept.
Figure 27:
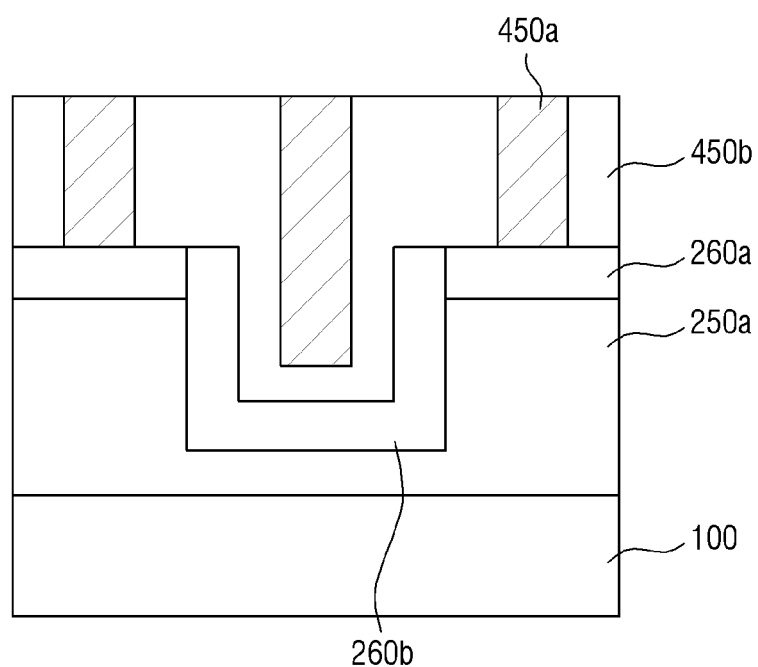

FIG. 22 is a flow chart for illustrating another method of forming a pattern of a semiconductor device according to some examples of the inventive concept. FIGS. 23 and 27 illustrate process steps in the method.

Referring to FIGS. 22 to 23, a lower film 250 is formed on a substrate 100, a neutral film 260 is formed on the lower film 250, and a second mask film pattern M2 is formed on the neutral film 260 (S200). The lower film 250 may be an insulation film of a single layer or multiple layers, and may include a conductive film.

Figure 24:
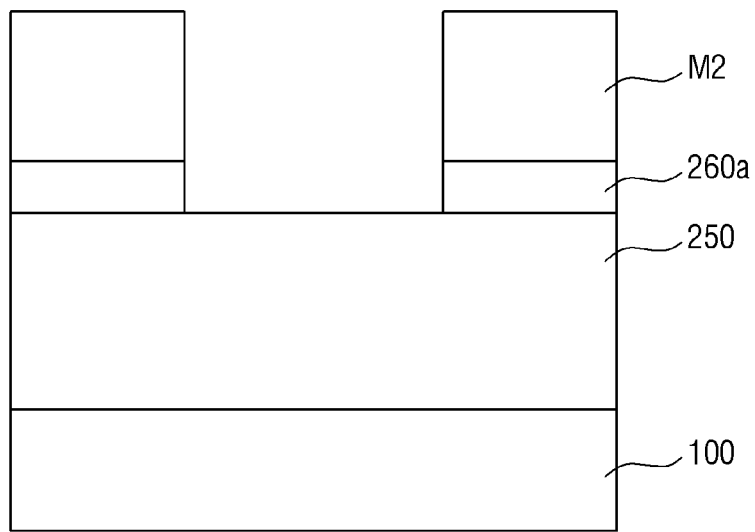
Figure 25:
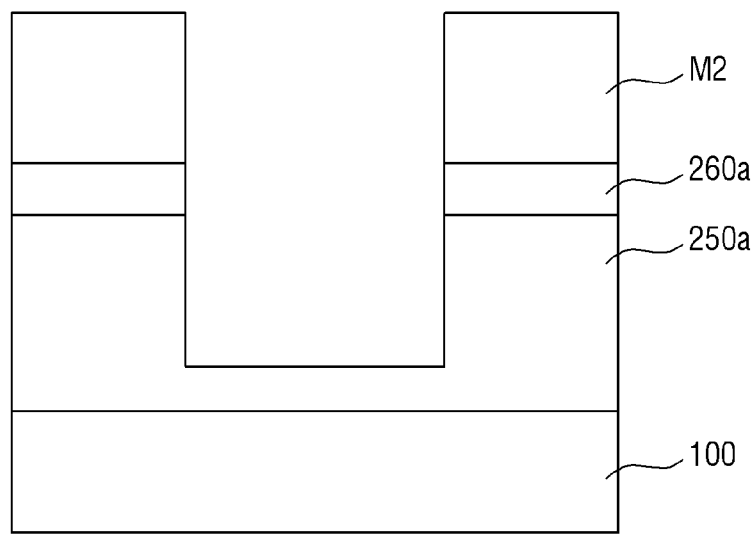

Referring to FIGS. 22, 24 and 25, holes are formed on the substrate 100 using the second mask film pattern M2. Specifically, part of the neutral film 260 is removed (S210) to form neutral film pattern 260*a*, and a trench is formed in the lower film 250 (S220) to thereby form the lower film structure 250*a*.

Figure 26:
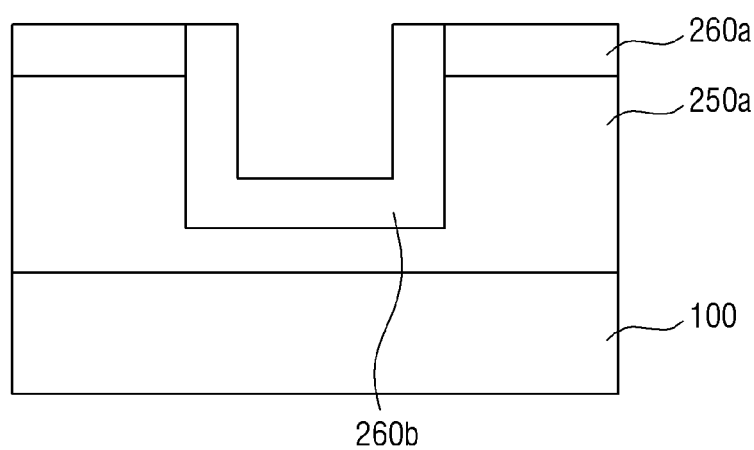

Referring to FIGS. 22 and 26, a hydrophobic film pattern 260*b* is formed along the bottom and sides of the trench of the lower film structure 250*a* (S230) such that the hydrophobic film pattern 260*b* conforms to the lower film structure 250*a*. The hydrophobic film pattern 260*b* may be formed by a coating process and an etching process. Because the hydrophobic film pattern 260*b* conforms to the lower film structure 250*a*, trenches may be defined by the hydrophobic film pattern 260*b*. As a result, a lower structure is formed on substrate 100.

Next, referring to FIGS. 22 and 27, block copolymer is formed on the hydrophobic film pattern 260*b* (S240). Then process S250, similar to process S130 described above with reference to FIGS. 3-17, is carried out to form first patterns 450*a* and a second pattern 450*b* spanning the first patterns 450*a* and interposed between each first pattern 450*a* and the hydrophobic film pattern 260*b*.

In this example, the hydrophobic film pattern 260*b* is formed in a trench of the lower film structure 250*a*, and a neutral film pattern 260*a* is formed on the top surface of the lower film structure 25a. In such a heterogeneous structure, the first patterns 450a formed on the hydrophobic pattern 260b are under a chemical bonding force with the hydrophobic film patterns 260b as well as a physical bonding force due to the difference in levels of the surfaces defining the trench, resulting in the creation of strong pinning power. Furthermore, first patterns 450a formed can be formed vertically as aligned with the neutral film pattern 260a because the neutral pattern 260a has affinity for both hydrophilic polymer and hydrophobic polymer, such that a directed self-assembly phenomenon can be facilitated. As a result, the first patterns 450a formed on the hydrophobic film pattern 260b in trenches as well as the first patterns 450a formed on the neutral pattern 260a receive strong pinning power, so that defects in the grid can be minimized.

The neutral film 260 may be made of a material that can induce a contact angle of 70 to 80° with respect to a solution of the block copolymer. For example, the neutral film 260 may be a self-assembled monolayer (SAM), a polymer brush, or cross-linked random copolymer mat.

Examples of the self-assembly monomolecular layer include: phenethyltrichlorosilane (PETCS), phenyltrichlorosilane (PTCS), benzyltrichlorosilane (BZTCS), tolyltrichlorosilane (TTCS), 2-[(trimethoxysilyl)ethl]-2-pyridine (PYRTMS), 4-biphenylyltrimethoxysilane (BPTMS), octadecyltrichlorosilane (OTS), 1-naphthyltrimehtoxysilane (NAPTMS), 1-[(trimethoxysilyl)methyl]naphthalene (MNATMS) and (9-methylanthracenyl)trimethoxysilane (MANTMS).

An example of the polymer brush is polystyrenerandompoly(methylmethacrylate) (PS-r-PMMA). The polymer brush may be composed of randomly bonded units hydrophilic and hydrophobic polymers. The polymer brush may also be referred to as brush-type random copolymer.

An example of the cross-linked random copolymer mat is benzocyclobutene-functionalized polystyrene-r-poly(methacrylate) copolymer.

Finally, processes S260 and S270, similar to processes S140 and S150 described with reference to FIGS. 3-17, are carried out to pattern the lower film structure 250a.

Hereinafter, a NAND flash memory manufactured by a method of forming a pattern of a semiconductor device according to the inventive concept will be described.

Figure 28:
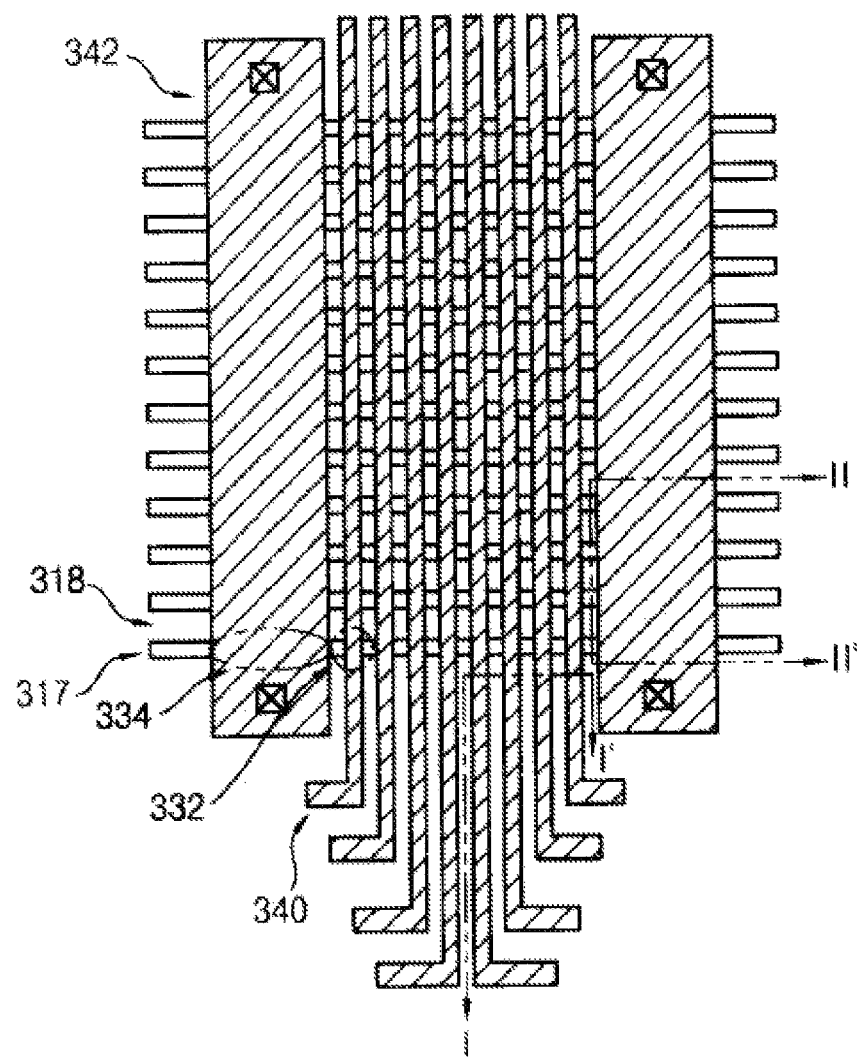
FIG. 28 is a plan view of a NAND flash memory manufactured by a method of forming a pattern of a semiconductor device according to the inventive concept.
Figure 29:
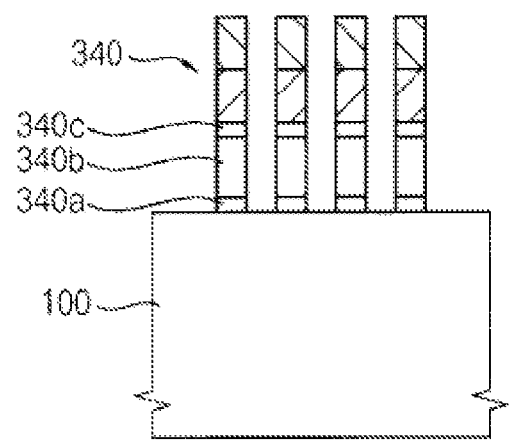
FIG. 29 is a cross-sectional view taken along line I-I' of FIG. 28.

FIG. 28 is a plan view of a NAND flash memory manufactured by a method of forming a pattern of a semiconductor device according to the inventive concept. FIG. 29 is a cross-sectional view taken along line I-I' of FIG. 28.

Referring to FIGS. 28 and 29, the top surface of a monocrystalline silicon substrate 100 is divided into an active area in which circuits are disposed, and an element separation area which divides the active area into active regions.

The active area includes linear active patterns 318 extending in a second direction as disposed repeatedly. The active pattern 318 has a line width limited by the resolution of a photolithography process. Trenches are formed between the active patterns 318. The trenches are filled with an insulative material to form element separation film patterns 317 constituting the element separation area.

Cell transistors 332, word lines and select transistors 334 are disposed on the active patterns 318.

The cell transistors 332 include a tunnel oxidation film pattern 340a, a floating gate electrode 340b, a dielectric film pattern 340c and a control gate electrode 340. Specifically, the tunnel oxidation film pattern 340a is disposed on the surface of the active pattern 317. The floating gate electrode 340b has an isolated pattern shape, and is disposed on the tunnel oxidation film pattern 340a. The dielectric film pattern 340c is disposed on the floating gate electrode 340a. In addition, the control gate electrode 340 disposed on the dielectric film pattern 340c has a line shape extending in a first direction perpendicular to the second direction and faces the floating gate electrode 340b disposed thereunder. The control gate electrodes 340 serves as the word lines.

In the NAND flash memory, the linear element separation film patterns and the linear control gate electrodes are formed by a method of forming a pattern of a semiconductor device according to the inventive concept similar to that described with reference to FIGS. 20 and 21.

Figure 30:
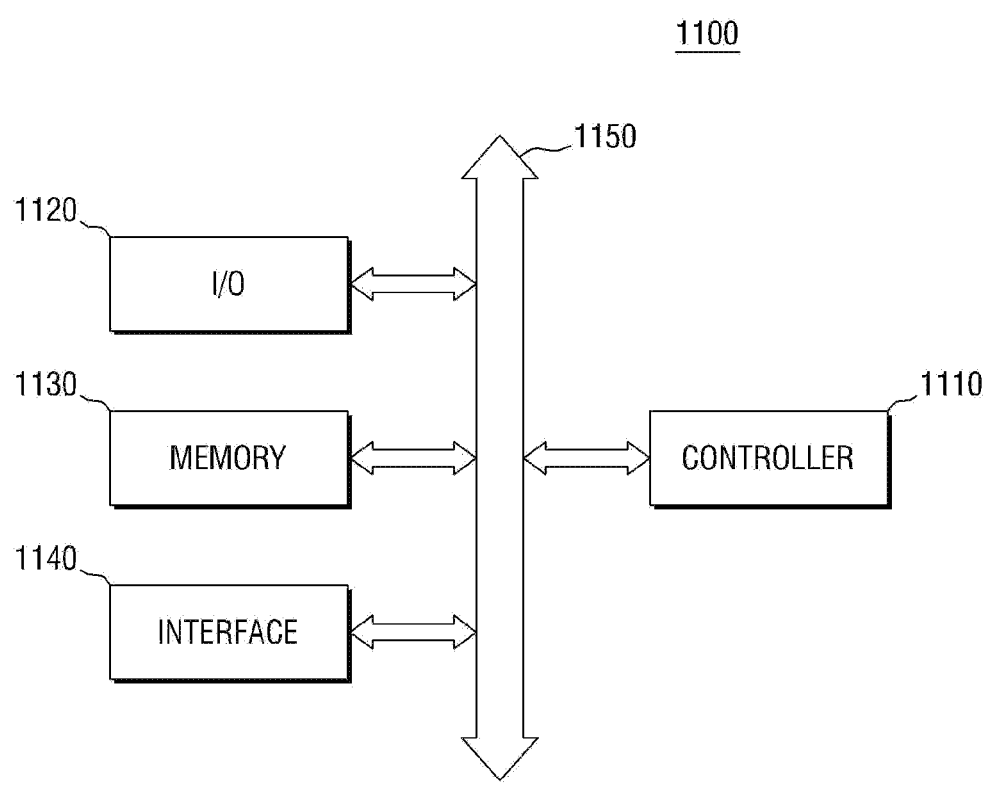
FIG. 30 is a block diagram of an electronic system including a semiconductor device fabricated using any one of the methods of forming a semiconductor device according to the inventive concept.

FIG. 30 is a block diagram of an electronic system including a semiconductor device fabricated by a method according to inventive concept.

Referring to FIG. 30, the electronic system 1100 may include a controller 1110, an I/O (input/output) device 1120, a memory device 1130, an interface 1140 and a bus 1150.

The controller 1110, the I/O device 1120, the memory device 1130 and/or the interface 1140 may be connected to one another via the bus 1150. The bus 1150 may serve as a path via which data is transferred.

The controller 1110 may include at least one of a microprocessor, a digital signal processor, a microcontroller and logic elements capable of performing similar functions.

The I/O device 1120 may include a keypad, a keyboard, a display device, etc. The memory device 1130 may store therein data and/or instructions, for example.

The interface 1140 may be capable of transmitting/receiving data to/from a communication network. The interface 1140 may be either a wired or wireless interface. For example, the interface 1140 may include an antenna, a wired/wireless transceiver or the like. In addition, the electronic system 1100 may further include a high-speed DRAM and/or SRAM, as an operational memory for improving the operation of the controller 1100.

Additionally, the memory device 1130, the controller 1110, or the I/O device 1120 may include a semiconductor device fabricated according to the inventive concept.

The electronic system 1100 may be that of a PDA (personal digital assistant), a portable computer, a web tablet, a wireless phone, a mobile phone, a digital music player, a memory card, or any electronic device capable of transmitting/receiving information in wireless environment.

Figure 31:
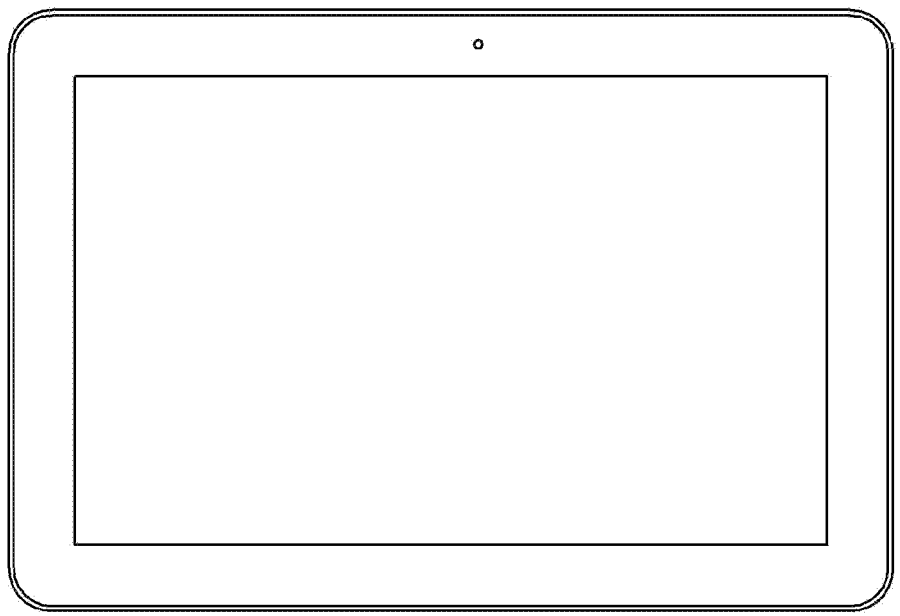
FIG. 31 is a plan view of a tablet.
Figure 32:
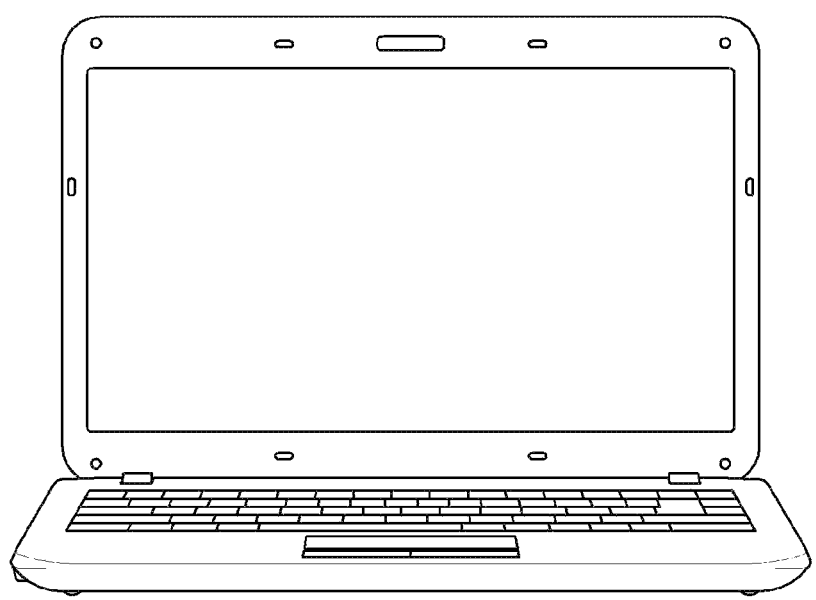
FIG. 32 is a front view of laptop as examples of electronic products that can employ semiconductor devices fabricated according to the inventive concept.

FIGS. 31 and 32 show examples of electronic products that can employ semiconductor devices fabricated by a method according to the inventive concept. FIG. 31 shows a tablet PC, and FIG. 32 shows a laptop computer. A table PC, a laptop computer, etc., may employ at least one semiconductor device fabricated according to the inventive concept. As will be appreciated by those skilled in the art, the inventive concept may be applied to devices other than those mentioned above.

Although examples of the inventive concept have been described with reference to the accompanying drawings, those skilled in the art will appreciate that various modifications and alterations may be made thereto without departing from the spirit or scope of the inventive concept. Therefore, it should be understood that the above-mentioned examples are not limiting but illustrative of the inventive concept.

What is claimed is:

1. A method of forming a pattern of features of a semiconductor device, the method comprising:
   forming a lower structure on a substrate, the lower structure having a top portion constituted by one of hydrophobic and hydrophilic material, and the lower structure defining recesses therein open at the top of the lower structure, said one of hydrophobic and hydrophilic material disposed in and/or defining the recesses;

forming an upper layer of block copolymer on the lower structure, wherein the block copolymer comprises hydrophobic material in a case in which the top portion of the lower structure is constituted by hydrophobic material and hydrophilic material in a case in which the top portion of the lower structure is constituted by hydrophilic material;

treating the block copolymer film to form first patterns spaced apart from one another, and a second pattern spanning the first patterns, respective ones of the first patterns being aligned with the recesses, respectively, and others of the first patterns being located at regions of the device between respective ones of the recesses;

the first patterns each being of polymeric material different from that of the second pattern, a selective removal process, based on the difference in the polymeric materials of the first patterns and the second pattern, of removing the first patterns aligned with the recesses and from said regions of the device between respective ones of the recesses while leaving material of the second pattern on the lower structure or of removing the second pattern while leaving material of the first patterns aligned with the recesses and disposed on said regions of the device between respective ones of the recesses; and subsequently performing an etch process using at least part of the the first patterns or the second pattern remaining after the selective removal process as an etch mask.

2. The method of claim 1, wherein the forming of the lower structure comprises:

forming a lower film on the substrate, etching the lower film at a top surface thereof to form holes or trenches in the lower film, and forming said one of the hydrophobic and hydrophilic material in the holes or trenches in the lower film.

3. The method of claim 2, wherein the forming of said one of the hydrophobic and hydrophilic material in the holes or trenches in the lower film comprises forming a conformal film of hydrophobic material on the lower film so as to extend along sides and bottoms of the holes or trenches in the lower film, the block copolymer comprises hydrophobic blocks of a polymer, and wherein the treating of the block copolymer forms the second pattern of hydrophobic blocks of the polymer such that the second pattern is interposed, at bottoms and sides of the holes or trenches, between the first patterns and the conformal layer of hydrophobic material.

4. The method of claim 3, wherein the forming of said one of the hydrophobic and hydrophilic material in the holes or trenches in the lower film comprises forming patterns of hydrophobic material along sides and bottoms of the holes or trenches in the lower film, and the forming of the lower structure further comprises forming a neutral film pattern on the top surface of the lower film, and the treating forms respective ones of the first patterns on the neutral film pattern.

5. The method of claim 4, wherein the forming of the neutral film pattern comprises forming on the lower film one of a self-assembled monolayer (SAM), a polymer brush, and a cross-linked random copolymer mat.

6. The method of claim 1, wherein the forming of the lower structure comprises forming a lower film on the substrate, and hydrophilic material is disposed in and/or defines the recesses, and the block copolymer comprises hydrophilic blocks of a polymer, and the treating of the block copolymer forms the first patterns of hydrophilic blocks of the first polymer directly on the hydrophilic material disposed in and/or defining the recesses as aligned with the recesses, respectively.

7. The method of claim 6, wherein the lower film has a flat upper surface, and the forming of the lower structure comprises forming a layer of hydrophilic material on the flat upper surface of the lower film, and etching the layer of hydrophilic material to define the recesses therein.

8. The method of claim 1, wherein the forming of the lower structure comprises etching the lower film, and conformally forming a film of hydrophilic material on the etched lower film.

9. A method of forming a pattern of features of a semiconductor device, the method comprising:

forming a lower film on a substrate and patterning the lower film to produce a first surface and a second surface disposed at different levels with the second surface being situated at a level beneath the level at which the first surface is situated;

forming an upper film of hydrophobic material on the lower film;

forming a film of block copolymer on the upper film;

phase-separating the film of block copolymer to form on the first and second surfaces first patterns spaced apart from one another, and a second pattern having spanning the first patterns and interposed between a bottom surface of each of the first patterns and the upper film, removing the first patterns; and subsequently performing an etch process using at least part of the second pattern as an etch mask.

10. The method of claim 9, wherein the forming the upper film comprises forming the upper film such that it conforms to the topography of the first surface and the second surface.

11. The method of claim 9, wherein the first patterns are hydrophobic, and the second pattern is hydrophilic.

12. The method of claim 9, wherein the film of block copolymer comprises polymethyl methacrylate (PMMA) and polystyrene (PS).

13. The method of claim 9, further comprising forming on the first surface a neutral film pattern, and wherein the film of block copolymer is formed on the second surface, and the neutral film pattern is formed of one of a self-assembled monolayer (SAM), a polymer brush, and a cross-linked random copolymer mat.

14. A method of forming a pattern of features of a semiconductor device, the method comprising:

providing a structure comprising a substrate, a lower film disposed on the substrate, and a neutral film disposed on the lower film;

removing part of the neutral film to expose a part of the lower film;

etching the exposed part of the lower film to form a trench;

forming a hydrophobic film in the trench;

coating the neutral film and the hydrophobic film with a block copolymer to form a block copolymer film on the neutral film and the hydrophobic film;

phase-separating the block copolymer film to form first patterns on the hydrophobic film in the trench and on the neutral film as spaced apart from one another, and a second pattern spanning the first patterns on the neutral film and the hydrophobic film, the second pattern being interposed between a bottom surface of the first pattern and the hydrophobic film in the trench, and the first patterns each being of polymeric material different from that of the second pattern, a selective removal process, based on the difference in the polymeric materials of the first patterns and the second pattern, of removing the first patterns while leaving material of the second pattern on the neutral film and the hydrophobic film; and performing an etch process using the material of the second pattern that spanned the first patterns, before the first patterns were removed, as an etch mask.

15. The method of claim 14, wherein the forming of the hydrophobic film in the trench comprises forming the hydrophobic film along a bottom and sides of the trench.

16. The method of claim 14, wherein the first patterns are hydrophobic, and the second pattern is hydrophilic.

17. The method of claim 14, wherein the block copolymer film comprises polymethyl methacrylate (PMMA) and polystyrene (PS).

18. The method of claim 17, wherein the hydrophobic film comprises polystyrene (PS).

19. The method of claim 17, wherein the neutral film is formed of one of a self-assembled monolayer (SAM), a polymer brush, and a cross-linked random copolymer mat.

20. The method of claim 14, wherein the removing of the first patterns comprises a dry etch process.

* * * * *